United States Patent
McWilliams

(10) Patent No.: US 6,739,035 B2
(45) Date of Patent: May 25, 2004

(54) COMPONENT PLACING AND TRANSFERRING APPARATUS

(75) Inventor: Larry W. McWilliams, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 340 days.

(21) Appl. No.: 09/854,788

(22) Filed: May 14, 2001

(65) Prior Publication Data

US 2001/0020326 A1 Sep. 13, 2001

Related U.S. Application Data

(62) Division of application No. 09/334,433, filed on Jun. 16, 1999, now Pat. No. 6,230,394.

(51) Int. Cl.[7] .............................................. B23P 19/00
(52) U.S. Cl. .......................... 29/740; 29/743; 29/760; 29/741; 29/786; 108/50.11
(58) Field of Search .......................... 29/740, 741, 786, 29/743, 760, 832, 834, 281.4, 840, 843; 198/351, 348; 108/50.11, 24; 269/903, 71, 73

(56) References Cited

U.S. PATENT DOCUMENTS

| | | | |
|---|---|---|---|
| 4,631,812 A | 12/1986 | Young | 29/714 |
| 4,694,570 A | 9/1987 | Rudolph et al. | 29/740 |
| 5,044,069 A | 9/1991 | Asai et al. | 29/740 |
| 5,410,801 A * | 5/1995 | Shiloh et al. | 29/740 |
| 5,615,995 A | 4/1997 | Nobile et al. | 414/798.2 |
| 5,692,292 A | 12/1997 | Asai et al. | 29/740 |
| 5,988,971 A | 11/1999 | Fossey et al. | 414/416 |
| 6,230,394 B1 * | 5/2001 | McWilliams | 29/740 |
| 6,481,099 B1 * | 11/2002 | McWilliams | 29/832 |

OTHER PUBLICATIONS

Fuji America Corporation; CP–642 High Speed Chip Placer; 1998; pp 1–3.
Fuji America Corporation, CP–43 High Speed Chip Placer; 1998; pp. 1–3.

* cited by examiner

Primary Examiner—Carl J. Arbes
Assistant Examiner—Minh Trinh
(74) Attorney, Agent, or Firm—Workman Nydegger

(57) ABSTRACT

The present invention relates to a transfer type circuit board fabricating system including a conveyor device for transferring circuit boards in a predetermined transfer direction through a component placing device for placing electronic components on the circuit boards. The conveyor device includes a pair of conveying surfaces for conveying the circuit boards and a pair of board supports for supporting one of the circuit boards. Each board support extends between and is supported by the pair of conveying surfaces. A table having a surface is situated below both the pair of conveying surfaces and the pair of board supports. A pair of deflection shields extend from and at an acute angle with respect to the surface of the table to terminate at an edge. Each edge is flush with and adjacent to one of the conveying surfaces and is also beneath the pair of board supports. The pair of deflection shields are positioned on the table such that when an electronic components strikes one of the deflection shields, the electronic component is thereby prevented from falling beneath the table.

17 Claims, 3 Drawing Sheets

COMPONENT PLACING AND TRANSFERRING APPARATUS

CROSS-REFERENCE TO RELATED APPLICATIONS

This application is a divisional of U.S. patent application Ser. No. 09/334,433, filed Jun. 16, 1999 now U.S. Pat. No. 6,230,394, which is being incorporated herein by reference.

BACKGROUND OF THE INVENTION

1. The Field of the Invention

The present invention relates in general to a transfer type fabricating system capable of placing electronic components on circuit boards such as printed circuit boards while the circuit boards are transferred by a conveyor device or devices through the working stations, and more particularly to a device that complements such a transfer type fabricating system to improved the efficiency thereof.

2. The Relevant Technology

The electronic industry is characterized by short product life spans or, at least, by product life spans having varying magnitude. Because of the high capitalization costs of dedicated assembly equipment, and because of short product life spans, dedicated assembly equipment is not particularly useful for the assembly of electronic components in small lots. Because of these difficulties with dedicated electronic assembly equipment, variable, programmable assembly techniques are now being widely utilized for the placement and assembly of electronic components on printed circuit boards.

Various machines and methods for the placement of electronic components in a circuit board are known in the prior art, including those disclosed in U.S. Pat. Nos. 5,696,292 and 5,044,069, each of which are issued to Assai et al., assigned to Fuji Machine Mfg. Co., Ltd., and incorporated herein by reference.

One example of a transfer type circuit board fabricating system includes a plurality of modules arranged in series. The first module can be a loading module that includes a conveyor device which is adapted to receive a printed circuit board (PC board) from a downstream fabricating assembly, and load the PC board onto another module which may apply a solder material to the PC board. The PC board is then moved to yet another module for the picking of electronic components and the placement of the same on the PC board. This module is often called 'pick and place' or a 'chip placer', an example of which is found in the Fuji CP-642 distributed by Fuji America Corporation located in Vernon Hills, Ill., USA.

In the pick and place module, a component placer head is movable within an area to retrieve a selected electronic component from a component supply device which accommodates a roll of a component carrier tape. The tape holds a multiplicity of electronic components or chips and has multiple recesses which are open in one of the opposite surfaces of the tape and which are spaced apart from each other in the longitudinal direction of the tape at a predetermined spacing interval. The recesses accommodate respective electronic components and are closed by a covering or waste tape.

In operation of the component supply device, the component carrier tape is intermittently fed by a suitable feed device from the roll at a pitch corresponding to the spacing interval of the component accommodating recesses of the tape. As the component carrier tape is fed, the covering or waste tape is removed to permit an access to the electronic components contained in the recesses, so that these components are successively fed one after another to a predetermined supply position. Suction from a nozzle mounted on a turret is used to pick a selected electronic component from a recess in the tape. The turret is then rotated so that the nozzle is in a position such that the nozzle can place the selected electronic component into desired location on a particular PC board.

A heating furnace as well known in the art is disposed downstream of the pick and place module and is used to heat the solder so as to fix the placed electronic components to the PC board.

In yet another example of an assembly of machines for producing a circuit board such as a printed circuit board, a number of working modules are required for programmably assembling PC boards. These working modules are configured in an assembly line, with each working module being utilized for fixing a certain subset of components to a particular PC board. A linear conveyor transports a circuit board along the assembly line from one working module to the next. In the assembly line, the circuit board is generally subjected to various operations such as: application of a creamy solder by screen printing to local portions of the substrate at which electronic components are placed; application of an adhesive material to those portions of the substrate; placement of electronic components on the substrate; and heating the creamy solder in an oven to fix the electronic components to the substrate.

An unloading module can be located downstream of a succession of the plurality of working modules as viewed in the predetermined transfer direction. The unloading module includes a conveyor device for removing the circuit boards from one of the working modules located at a downstream end. The circuit boards on which the intended operations in all the working modules have been completed are automatically removed by the unloading device from the system.

Each working module can include a component placing device for placing electronic components on the circuit boards, and a component imaging device for obtaining image data representative of an attitude of each of the electronic components when each electronic component is held by the component placing device. The component imaging device can also detect a dropped or missing electronic components prior to mounting onto a printed circuit board.

With programmable assembly techniques, one working module uses robotic means for selecting individual electronic components from a storage area and for transporting those selected components to an assembly station. At the working module, the robotic means properly locates the components with respect to the printed circuit board. Because the robotic means can be programmable, various circuits may be assembled, and the high capital cost of dedicated assembly equipment is avoided as well.

In the case of the robotic means or component placing device arranged to place electronic components or chips on a substrate or PC board, the placing device includes a placer head for placing the components on the substrate, a three-dimensional positioning device for positioning the placer head along three axes, and a controller for controlling the placer head and positioning device. The component placing device usually has a placer head which holds the electronic component and which is positioned to place the electronic component at the desired position on the circuit. A vacuum pump is used for operating the placer head of the component placing device to hold the electronic component by vacuum suction, for example.

The electronic components to be placed on the circuit boards by the component placing device may be optionally coated with a suitable fixing material for provisionally fixing the electronic components on the circuit boards. To prevent dislocation of the electronic components, it is desirable to provisionally fix the electronic components on the circuit boards. To this end, the electronic components are coated with the fixing material, by contacting the electronic components with the material held by the material holder, before the electronic components are placed on the circuit boards. Thus, the electronic components are provisionally fixed on the circuit boards. The fixing material may be a flux or a liquid agent. Where the electronic components are fixed by a solder on the circuit boards, the solder is melted by heat application in a suitable heating furnace at another working module, so that the electronic components are permanently fixed or bonded to the circuit boards by the solder. In this respect, it is noted that the electronic components placed on the circuit boards may be dislocated from the nominal positions, while the circuit boards are transferred with the electronic components into the heating furnace.

One system for supplying electronic components for placement on the PC board involves the accommodation of electronic components in component supply pallets in a pallet storage. A pallet support block and the pallet storage are moved by a first moving device relative to each other so that a pallet rack supporting the component supply pallet which accommodates the electronic components to be placed on the appropriate circuit board has the same height as the pallet support block. Then, the pallet supply pallet in question is moved by a second moving device onto the pallet support block. The component placing device receives the electronic components one after another from the component supply pallet placed on the pallet support block, and places the received electronic components on the circuit board. The component supply device which uses the component supply pallets as described above is suitable to supply the electronic components which have comparatively large sizes or specially-shaped electronic components such as connectors and sockets.

The conveyor device of each of the plurality of working modules includes a plurality of conveyors which are disposed in series in the predetermined transfer direction of the circuit boards. In this case, the loading and unloading of the electronic components onto and out of the present fabricating system may take place at different times. That is, an unloading operation to remove the circuit board on which the electronic components have been placed and a loading operation to introduce the circuit board on which the working operations are to be performed may take place at different times, so that the fabricating system provides increased operating flexibility and efficiency.

A random access surface mounted component transport system used in the population of components in PC board fabrication may include an elongated movement mechanism including a multiple component carrier. The mechanism can have a plurality of adjacent loading points and a downstream off-loading station, where there are a plurality of adjacent component carrier media that are disposed adjacent the movement mechanism. Each component carrier media is associated with a different one of the loading points.

Despite their success, a number of problems remain with prior art programmable PC board assembly techniques utilizing robotic means for the placement of electronic circuit components on substrates or printed circuit boards. Typical printed circuit boards require the placement of a large number of differing components with respect to a single circuit board. Space constraints, however, limit the number of differing components which may be assembled on a given substrate or circuit board with a given robotic assembly machine. Space constraints may be increasingly severe as the number of electronic components to be placed on a PC board increases. With the increase in the number and diverse sizes and shapes of electronic components to be placed on a PC board, problems may occur. These problems are inherent in the difficulty of robotic placement of the electronic components. One such problem is the improper placement or dropping of electronic components during the pick and place operation.

Another problem, which is further complicated by the foregoing problem, is the difficulty caused by a loss of attachment between a placer head of a component placing device and an electronic component which is to be positioned and placed at a desired position on the circuit. Such a loss could be, for example, a loss of in the vacuum force between the electronic component and a nozzle applying the vacuum thereto. Loss of vacuum or other attachment force causes the electronic component held by the place head to fall from the placer head. The place where the fallen electronic component ends up will undoubtedly be other than a respectively proper sites on the printed circuit board.

Particularly troublesome is the problem of the electronic component falling to a resting place that is not easily accessible to maintenance personnel. It is even more problematic that, after a period of time, an accumulation of fallen electronic components can cause a malfunction of the working module of the linear conveyor that transports circuit boards along the assembly line from one working module to the next. A prolonged and expensive maintenance procedure must then be taken that ultimately reduces throughput of the PC board assembly line. It would be an advance in the art of electronic component placement devices and techniques to provide apparatuses and methods that limit or otherwise prevent fallen electronic components from ending up at or accumulating in inaccessible locations that are problematic to such electronic component placement devices and techniques. Such apparatuses and methods are disclosed and claimed hereinafter.

BRIEF SUMMARY OF THE INVENTION

The invention can be summarized as a conveying apparatus that includes a conveyor, a table surface, and a shield structure. The conveyor has an edge that moves in an X-axis direction. The table surface is positioned in a Z-axis direction below but not immediately beneath the endless conveyor structure and is adapted for movement in the X-axis and Y-axis directions. The shield structure is secured to and extends from the table surface to an edge that is parallel to and flush with the edge of the conveyor. When the edge of the conveyor moves in the X-axis direction, the edge of the structure is stationary with respect to the table surface and is not stationary with respect to the edge of the conveyor.

The conveying apparatus may also include a transferring means for moving circuit boards on the conveyor, a component placing means for placing components on the circuit boards moving on the conveyor, a storage means disposed adjacent to the conveyor for storing the components, and a loading means positioned in the Z-axis direction above the transfer means for moving the components from the storage means to one of the circuit boards on the transferring means.

When the loading means releases one of the components between the storage means and one of the circuit boards on the transferring means so as to fall at least partially in the Z-direction in a projection that is between the edge of the conveying structure and an end of the table surface that is near the edge of the conveying structure, it is preferable that the shield structure is positioned on the table surface such that the falling component will strike the shield structure and will thereby be prevented from falling in the Z-direction below the table surface.

The present invention can be stated as providing apparatuses and methods for preventing falling electronic components in a pick and place operation from ending up at or accumulating in inaccessible locations. Such a pick and place operation can be in a transfer type circuit board fabricating system. The transfer type circuit board fabricating system includes a conveyor device for transferring circuit boards through a component placing device for placing electronic components on the circuit boards. In conjunction with the transfer type circuit board fabricating system there is provided a pair of conveying surfaces for conveying the circuit boards and a pair of board supports for supporting one of the circuit boards. Each board support extends between and is supported by the pair of conveying surfaces.

A table having a surface thereon is also provided. The table can be adapted to move parallel to, perpendicular to, and vertically with respect to a plane defined between the pair of conveying surfaces. The table is situated below both the pair of conveying surfaces and the pair of board supports. A pair of deflection shields are provided, each of which extend from the surface of the table to terminate at an edge. Each edge is adjacent to one of the conveying surfaces and beneath the pair of board supports.

In one embodiment, the surface of the table does not extend immediately beneath either of the pair of conveying surfaces. As such, when an electronic component falls in a direction that projects between one of the conveying surfaces and the surface of the table, the electronic component strikes a respective one of the deflection shields and the electronic component is thereby prevented from falling beneath the table.

In another embodiment, the surface of the table has parallel opposite sides with a width therebetween that is larger than a width between the pair of conveying surfaces. The surface of the table does not extend immediately beneath either of the pair of conveying surfaces. As such, when an electronic component falls in a direction that projects between one of the conveying surfaces and a respective side of the surface of the table, the electronic component strikes a respective one of the deflection shields and the electronic component is thereby prevented from falling beneath the table.

Preferably, the conveyor device transfers the circuit boards in a predetermined transfer direction through the component placing device. It is also preferable that each deflection shield extends at an acute angle with respect to the surface of the table and is flush with one of the conveying surfaces.

An electronic component storage is disposed adjacent to the pair of conveying surfaces. Also, a loading apparatus is positioned above the pair of board supports for moving selected electronic components from the electronic component storage to an appropriate position on a circuit board that is supported by the pair of board support. The loading apparatus includes a vacuum manifold and a nozzle. The vacuum manifold is operated to communicate a vacuum pressure to the nozzle. The nozzle grips a selected electronic component from the electronic component storage. The nozzle is then used to move the selected electronic components from the electronic component storage to an appropriate position on a circuit board that is supported by the pair of board supports.

With respect to the deflection shields, it is preferable that they be positioned on the table such that when one of the selected electronic components falls from the nozzle, such as by a loss of vacuum pressure, and then strikes one of the deflection shields, the falling electronic component is thereby prevented from falling beneath the table. As such, falling electronic components are prevented from ending up or otherwise accumulating in an inaccessible location beneath the table.

In yet another embodiment of the invention associated with a transfer type circuit board fabricating system, there are a plurality of working modules each of which includes a conveyor device for transferring circuit boards in a predetermined transfer direction, and an electronic component placement device for placing electronic components on PC boards. The PC board is mounded above an X-Y table on a conveyor device which moves the PC board through the circuit board fabricating system. A pick and place device moves selected electronic components from a storage location to the PC board. On occasion, a selected electronic component will fall from the pick and place device before placement on the PC board. The direction the fall can be in a projection that is between the conveyor device and the X-Y table. A shield is provided to prevent the falling electronic components from falling beneath the X-Y table to an inaccessible place. The shield, which is mounted to the X-Y table and extends to the conveyor device, prevents falling electronic components from falling below the X-Y table. As such, falling electronic components are prevented from ending up or otherwise accumulating in an inaccessible location beneath the X-Y table.

These and other features of the present invention will become more fully apparent from the following description and appended claims, or may be learned by the practice of the invention as set forth hereinafter.

These and other objects and features of the present invention will become more rally apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to figures wherein like structures will be provided with like reference designations. It is to be understood that the drawings are diagrammatic and schematic representations of the embodiment of the present invention and are not limiting of the present invention nor are they necessarily drawn to scale.

The Figures relate to embodiments of the invention as expressed in apparatuses and methods that limit or otherwise prevent fallen electronic components from ending up at or accumulating in inaccessible locations in electronic component transport systems used in the population of mounted electronic components in printed circuit board fabrication, and so overcome the problems of the prior art.

Figure 1:
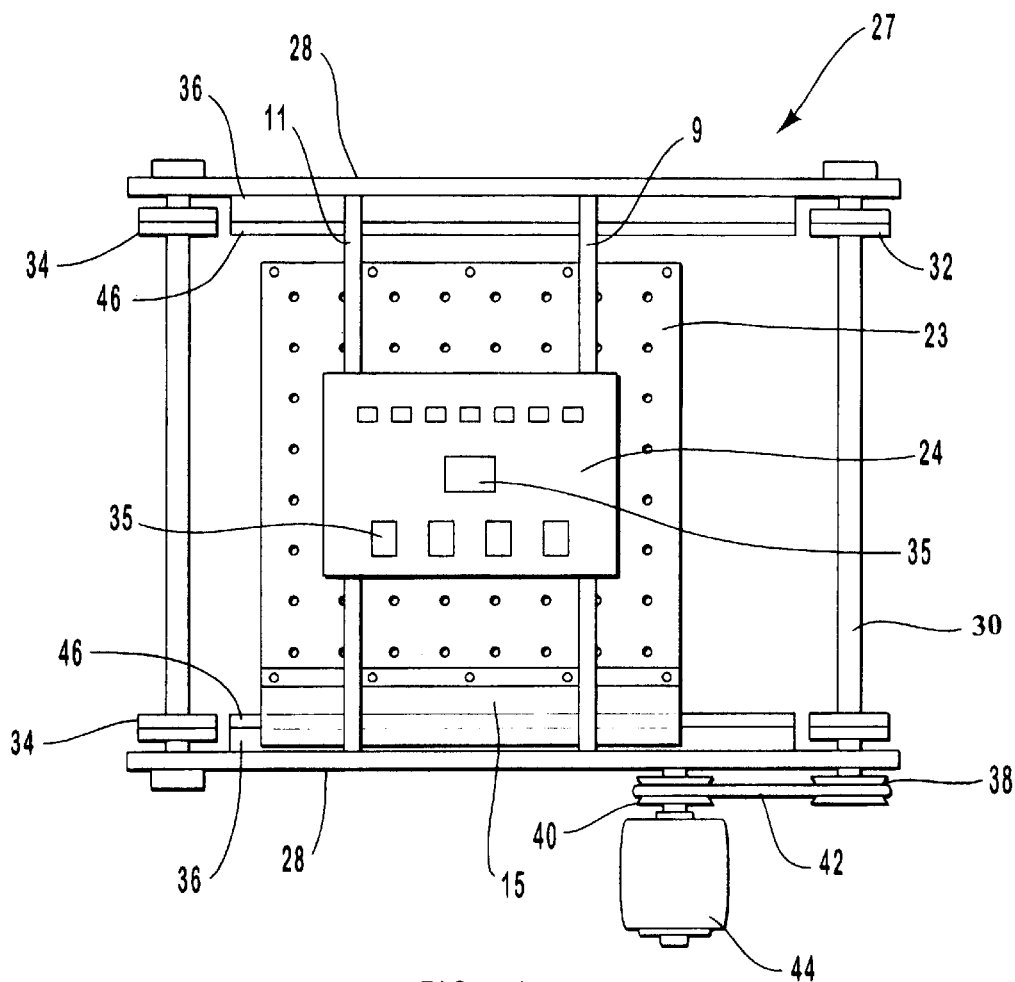
FIG. 1 is a top plan view of a portion of a component placing machine that includes a conveying system to convey a PC board within a component placing machine that places electronic components on the PC board, where an X-Y table is below the PC board, the X-Y table having a shield attached thereto to directing the movement of falling electronic components.

FIG. 1 shows a portion of a component placing machine that has a conveying apparatus. The conveying apparatus includes a transferring means for moving circuit boards on the conveyor. An example of such a transferring means is seen in FIG. 1 as a conveyor device 27. Conveyor device 27 includes an X-Y table 23. Conveyor device 27 conveys PC board 24 through a working module that places electronic components 35 on PC board 24. As schematically shown in FIG. 1, conveyor device 27 includes a belt conveyor which has a pair of parallel side frames 28 disposed in parallel with an X-axis direction (horizontal direction as seen in FIG. 1) on which PC board 24 is transferred or conveyed. A drive shaft 30 is rotatably supported by side frames 28, at one end of each side frame 28 in the X-axis direction. Drive shaft 30 has an axis of rotation which is parallel to a Y-axis direction perpendicular to the X-axis direction. The X axis and Y axis define a horizontal plane (plane of the view in FIG. 1). Drive shaft 30 has two drive pulleys 32 fixed to its opposite end portions.

To the other end of each side frame 28, there is rotatably attached a driven pulley 34, which has an axis of rotation parallel to the Y-axis. Drive and driven pulleys 32, 34 on each side frame 28 are connected by an endless belt 36. Drive shaft 30 is operatively connected to a conveyor drive motor 44 through sprocket wheels 38, 40 and a chain 42 connecting sprocket wheels 38, 40. With drive shaft 30 rotated by motor 44, endless belts 36 are rotated by drive pulleys 32, whereby PC board 24 is transferred by endless belts 36. The two side frames 28 have respective guide plates 46 attached to their inner surfaces. These guide plates 46 function to support or guide endless belts 36 at their lower spans. The inner surfaces of side frames 28 function to guide PC board 24 while PC board 24 is transferred by endless belts 36.

Also seen in FIG. 1 are conveyor supports 9 and 11 which are secured to side frames 28. Conveyor supports 9 and 11 support PC board 24 as it moves along the conveyor device 27. Conveyor supports 9 and 11 hold PC board 24 above X-Y table 23 so that PC board 24 does not contact X-Y table 23.

Figure 2:
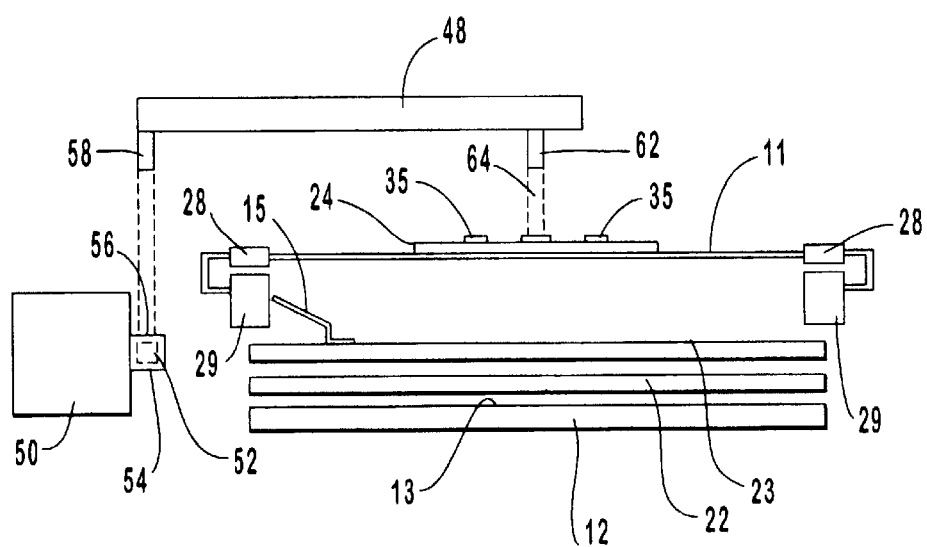
FIG. 2 is a side elevational view of the PC board and other components seen in FIG. 1 within the component placing machine.

The invention includes a component placing means for placing components on the circuit boards moving on the conveyor, a storage means disposed adjacent to the conveyor for storing the components, and a loading means positioned in the Z-axis direction above the transfer means for moving the components from the storage means to one of the circuit boards on the transferring means. An example of the component placing means and the loading means is seen in FIG. 2 as a turret 48 having a vacuum nozzle 58, 62 projecting from turret 48. An example of the storage means is seen in FIG. 2 as a component supply station 50.

FIG. 2 shows conveyor support 11 supporting PC board 24 above X-Y table 23. Support frame 22 is seen positioned between X-Y table 23 and an under frame 12. The two support structures 29 seen in FIG. 2 are meant to represent the various hardware required to secure X-Y table 23, support frame 22, and lower frame 13 in their relative positions. Additionally, support structures 29 also represent the required hardware and functions accomplished thereby for the conveying structure depicted in FIGS. 1 and 2. FIG. 2 shows the relationship of side frames 28 to support structures 29.

Conveyor supports 9 and 11, seen in FIGS. 1 and 2, are preferably made of an elastomer, plastic, or a rubber material and are approximately one-eight inch in width. Conveyor supports 9 and 11 extend between the two side frames 28. A shield 15 is seen flush with and adjacent to one side frame 28. Although one shield 15 is illustrated, another shield 15 can optionally be installed flush with and adjacent to the opposite side frame 28. It is preferred that a separation of approximately one-sixteenth inch exists between shield 15 and side frame 28. The relative positioning of conveyor supports 9 and 11 with respect to X-Y table 23 is that there should be no contact between conveyor supports 9 and 11 and X-Y table 23.

Also seen in FIG. 2 are the pair of parallel side frames 28 having therebetween X-Y table 23. PC board 24 has chips 35 placed thereon. X-Y table 23 has mounted thereto a first shield 15 at one end of X-Y table 23, and optionally, a second shield 15 at an opposite end of X-Y table 23. In addition to shields 15, conveyor device 27 can be provided with structures that prevent electronic components from falling past the other two opposite ends of X-Y table 23 that are not covered by shields 15. As can be seen in FIG. 2, X-Y table 23 has a width between parallel opposite sides. Also, side frames 28 have a width therebetween that is less than a width between the parallel opposite sides of side frames 28. As such, the opposite ends of X-Y table 23 are below but not immediately beneath either of side frames 28.

Positioned below X-Y table 23 is under frame 12 having a surface 13 thereon. Each side frame 28 has therebelow support structure 29 for carrying under frame 12. Positioned above X-Y table 23 is a turret 48. Turret 48 has a vacuum nozzle 58, 62 projecting therefrom.

A component supply station 50 has a roll of tape therein for dispensing electronic components. FIG. 2 shows an electronic component 52 situated in a pocket 54 of the tape within component supply station 50. A covering or waste tape 56 is peeled off from pocket 54 to expose electronic component 52. When so exposed, nozzle 58 can project from turret 48 down into pocket 54 so as to make a vacuum grip upon electronic component 52 as shown in phantom at 60. When so gripped, nozzle 58 retracts along phantom line 60. Next, turret 48 rotates nozzle 58 into the nozzle position shown at reference numeral 62. Then, nozzle 62 projects along the phantom line 64 so as to place electronic component 52 on PC board 24 as seen at reference numeral 35 or at another location on PC board 24.

But for the placement of shields 15 on X-Y table 23, an electronic component 52 upon which a vacuum grip is lost by the nozzle projecting from turret 48 may fall from nozzle 58, 62 below X-Y table 23 and onto surface 13 of under frame 12. As such, the accumulation of misplaced electronic components 52 shall not accumulate upon surface 13 of under frame 12. This preventive positioning of shields 15 is seen in that, in operation, nozzle 58, 62 will occasionally lose vacuum pressure that is applied to electronic component 35, 52. Such a loss of pressure can occur when electronic component 35, 52 is being rotated on turret 48 in a path that is above and between pocket 54 and PC board 24 seen in FIG. 2. When the release of electronic component 35, 52 from nozzle 58, 62 causes the same to fall at least partially in the Z-direction in a fall that projects between side frame 28 and a respective end of X-Y table 23, falling component 35, 52 will strike shield 15 and will thereby be prevented from falling in the Z-direction below X-Y table 23 on to support frame 22 or on to lower frame 13.

Figure 3:
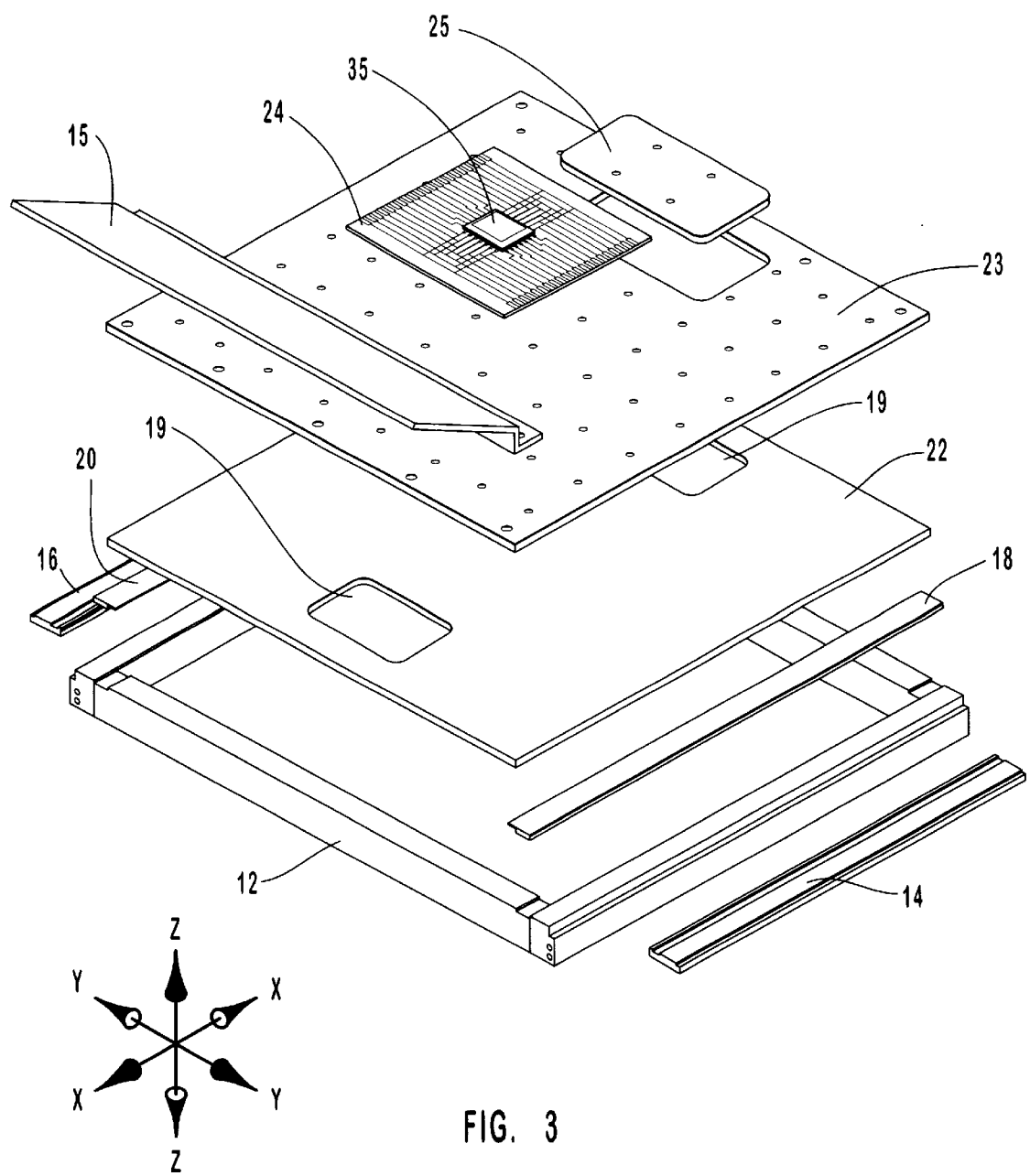
FIG. 3 is an exploded view of the PC board, the X-Y table, and other components of the conveying system seen in FIG. 1.

FIG. 3 shows an exploded view of a portion of FIG. 2 which is shown in a simplified form having removed therefrom numerous and miscellaneous hardware required for the assembly of the completed portion thereof as seen in FIGS. 1 and 2. Specifically, a pair of shields 15 are shown exploded from attachment to X-Y table 23. A removable board 25 is optionally within X-Y table 23. PC board 24 is also shown above X-Y table 23. PC board 24 has electrical components 35 attached thereto. Support frame 22 is situated in brackets 14, 16 attached thereto. Support frame 22 has left and right brackets 18, attached thereto. A window 19 maybe situated in support frame 22.

As seen in FIG. 3, surface 13 represents a potential accumulation point for misplaced electronic components that fall off of the vacuum nozzle 58, 62 of turret 48 as seen in FIG. 2. In order to prevent the accumulation of electronic components upon surface 13 of under frame 12, first and second shields 15 are mounted upon X-Y table 23 as illustrated in FIG. 3. As such, prolonged and expensive maintenance to remove electronic component from surface 13 is thereby prevented by the presence of first and second shields 15.

Figure 4:
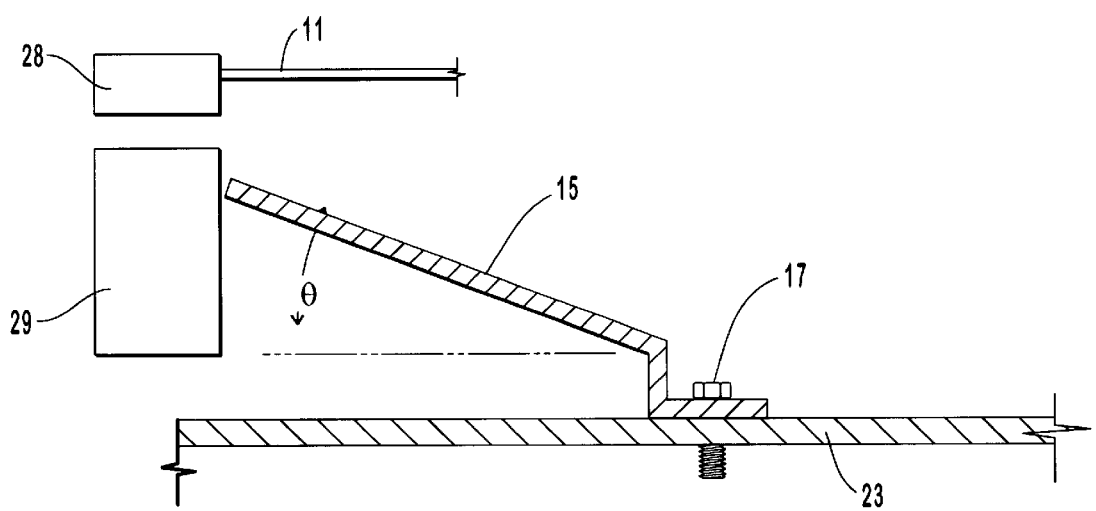
FIG. 4 is a partial side elevational view of the shield, the X-Y table, and the conveying system seen in FIG. 1.

FIG. 4 is a front elevational view of shield 15 which shows X-Y table 23 having a cap screw 17 therethrough. Cap screw 17 secures shield 15 to X-Y table 23. Shield 15 makes an angle θ with respect to X-Y table 23. Each shield 15 extends from X-Y table 23 to be approximately flush with a corresponding side frame 28. Preferably angle θ will be approximately 20.8 degrees. Shield 15 extends vertically from X-Y table 23 approximately 0.187 inches and extends at angle θ with respect to X-Y table 23 for approximately 2.391 inches. Additionally, shield 15 extends parallel to X-Y table 23 for approximately one-half inch.

Figure 5:
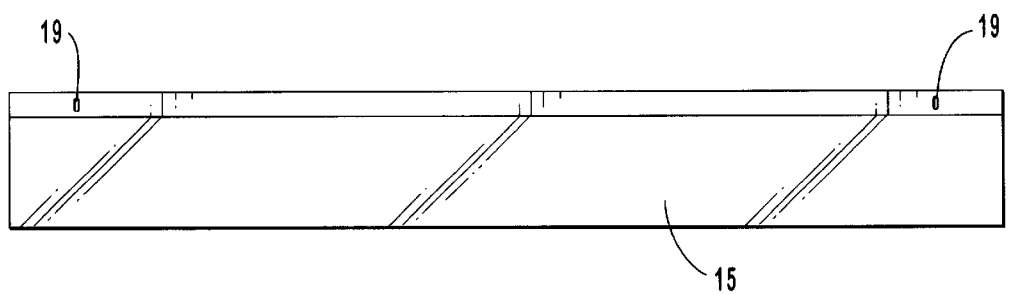
FIG. 5 is a top plan view of the inventive shield of FIG. 1.
Figure 5A:
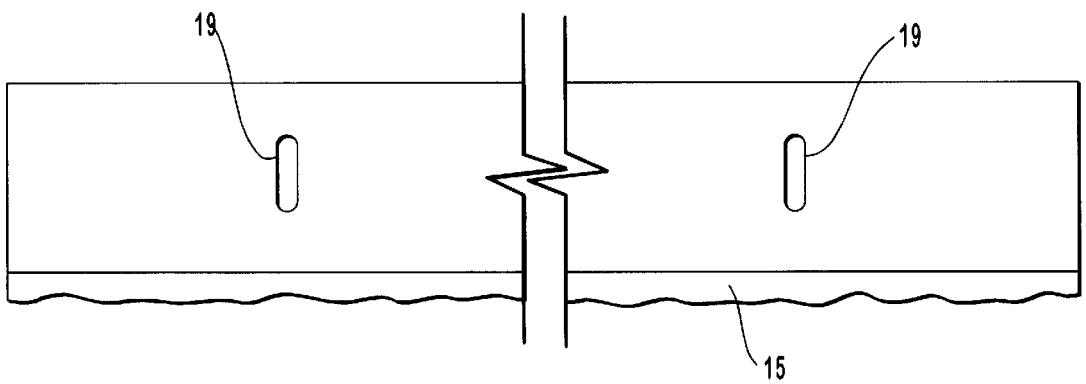
FIG. 5A is a partial view of FIG. 5.

FIG. 5 is a top land view of shield 15 showing a pair of slots 19 extending therethrough. Shield 15 has a length of approximately 20" and a distance between slots 19 of approximately 17.314 inches. FIG. 5A shows a cut away view of shield 15 in a larger view, not necessarily to scale. Preferably, slots 19 will have a length of approximately a quarter of an inch and will be centered with respect to a parallel of a portion of shield 15 with respect to PC substrate 23. Preferably, shield 15 will be approximately 1 millimeter thick and will be composed of stainless steel or other corrosion resistant materials. Cap screw 17 can be another type of fastener such as an allen head screw, and can be made of non-corrosive materials, although nickel is preferred.

From the foregoing it should be evident that there has herein been described apparatuses and methods that limit or otherwise prevent fallen electronic components to end up at or accumulate in inaccessible locations in electronic component transport systems used in the population of mounted electronic components in printed circuit board fabrication.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed is:

1. A conveying apparatus for circuit boards, comprising:
    a conveyor having an edge that moves in an X-axis direction, wherein said conveyor comprises a side frame and at least one conveyor support secured to the side frame;
    a table surface positioned in a Z-axis direction below but not immediately beneath the conveyor and adapted for movement in the X-axis and Y-axis directions; and
    a shield structure secured to and extending from the table surface to an edge that is parallel to and flush with the edge of the conveyor, wherein when the conveyor moves in the X-axis direction the edge of the structure:
        is stationary with respect to the table surface; and
        is not stationary with respect to the edge of the conveyor.

2. The conveying apparatus as defined in claim 1, further comprising:
    transferring means for moving circuit boards on the conveyor;
    component placing means for placing components on the circuit boards;
    storage means, disposed adjacent to the conveyor, for storing said components;
    loading means, positioned in the Z-axis direction above the transferring means, for moving said components from the storage means to one of said circuit boards on the transferring means.

3. The conveying apparatus as defined in claim 2, wherein when the loading means releases one of said components between the storage means and one of said circuit boards on the transferring means so as to fall at least partially in the Z-direction in a projection that is between the edge of the conveying structure and a periphery of the table surface proximal to the edge of the conveying structure, the falling component strikes the shield structure and is thereby prevented from falling in the Z-direction below the table surface.

4. The conveying apparatus as defined in claim 1, further comprising:
    a circuit board component supply station; and
    a rotating turret provided with at least one circuit board component grip/release device.

5. The conveying apparatus as defined in claim 4, wherein the grip/release device is configured for obtaining circuit board components from the supply station and placing them on a circuit board placed on the conveyor, such that when the grip/release device releases one of the circuit board components between the supply station and a circuit board placed on the conveyor, so as to fall at least partially in the Z-direction in a projection that is between the edge of the conveying structure and a periphery of the table surface proximal to the edge of the conveying structure, the falling component strikes the shield structure and is hereby prevented from falling in the Z-direction below the table surface.

6. The conveying apparatus as defined in claim 4, wherein said circuit board component grip/release device is a vacuum nozzle.

7. A conveying apparatus for circuit boards, comprising:

an endless conveyor for holding a circuit board that is to receive electronic components thereon and within said circuit board's perimeter, the endless conveyor having a width and an edge that moves in an X-axis direction, wherein said conveyor comprises a side frame and at least one conveyor support secured to the side frame;

a table surface positioned in a Z-axis direction below, but not immediately beneath, the endless conveyor structure, wherein the table surface is positioned for movement in the X-axis and Y-axis directions; and at least one deflection shield extending from and at an angle with respect to the table surface to terminate at an edge, such that when an electronic component is released outside said circuit board's perimeter and between said circuit board's perimeter and said edge of the at least one deflection shield, the released electronic component strikes the at least one deflection shield and is thereby prevented from falling beneath the table surface.

8. The conveying apparatus as recited in claim 7, wherein said at least one conveyor support comprises two conveyor supports.

9. A conveying apparatus as recited in claim 7, wherein:

the endless conveyor comprises a pair of conveying surfaces; and said at least one deflection shield is flush with one of the conveying surfaces.

10. A conveying apparatus as recited in claim 7, further comprising:

the endless conveyor comprises a pair of conveying surfaces;

a circuit board electronic component storage adjacent to the pair of conveying surfaces; and a loading device for moving circuit board electronic components from the storage to the circuit board that is supported by the pair of conveying surfaces.

11. A conveying apparatus for circuit boards, comprising:

a circuit board conveyor with at least one conveying surface;

at least one circuit board support that is supported by said at least one conveying surface;

a table having a surface thereon that is situated below the at least one conveying surface and below the at least one circuit board support; and at least one deflection shield that extends from the surface of the table and terminates at an edge, wherein said edge is adjacent to said at least one conveying surface and said edge is beneath said at least one circuit board support wherein at least a portion of said at least one deflection shield extends from the surface of the table at an angle, and such that when a circuit board electronic component falls down in the direction from the at least one conveyor surface to the surface of the table, the electronic component is intercepted in its fall by said at least one deflection shield, so that the electronic component is thereby prevented from falling beneath the table.

12. The conveying apparatus as recited in claim 11, wherein the at least one conveying surface comprises two conveying surfaces and the at least one circuit board support comprises two circuit board supports, and further comprising:

an electronic component storage adjacent to the conveying surfaces; and a loading device above the board supports for transferring at least one electronic component from the electronic component storage to the circuit board that is supported by the board supports.

13. The conveying apparatus as recited in claim 12, wherein the loading device comprises a vacuum nozzle.

14. The conveying apparatus as recited in claim 12, wherein the loading device comprises a rotating turret having at least one vacuum nozzle extending therefrom.

15. The conveying apparatus as recited in claim 11, wherein said at least one conveying surface comprises a first and a second conveying surfaces, said at least one circuit board support comprises a first and a second circuit board supports, the first conveying surface supporting the first circuit board supports, and said at least one deflection shield comprises one deflection shield that extends from the surface of the table and terminates at an edge, such that said edge is adjacent to the first conveying surface and said edge is beneath the first circuit board support.

16. The conveying apparatus as recited in claim 11, wherein said at least one deflection shield is removably attached to the surface of the table.

17. The conveying apparatus as recited in claim 11, wherein said at least one deflection shield is removably screwed to the surface of the table.

* * * * *

UNITED STATES PATENT AND TRADEMARK OFFICE
CERTIFICATE OF CORRECTION

PATENT NO. : 6,739,035 B2
DATED : May 25, 2004
INVENTOR(S) : Larry W. McWilliams It is certified that error appears in the above-identified patent and that said Letters Patent is hereby corrected as shown below:

Column 1,
Line 19, change "improved" to -- improve --

Column 3,
Line 32, before "supply pallet" remove "pallet"

Column 4,
Line 27, after "respectively proper" change "sites" to -- site --

Column 5,
Line 66, after "board" change "support." to -- supports. --

Column 6,
Line 30, after "The direction" insert -- of --.
Lines 43-46, remove repeated paragraph beginning with "These and other objects"

Column 8,
Line 25, after "approximately" change "one-eight" to -- one-eighth --

Column 9,
Line 29, after "situated in" insert the following missing line:
-- between under frame 12 and X-Y table 23. Under frame 22 has left and right brackets 18, --

Column 11,
Line 3, change "hereby" to -- thereby --
Lines 18-19, change "conveyor structure," to -- conveyor, --
Lines 32, 37 and 48, change "A conveying" to -- The conveying --

UNITED STATES PATENT AND TRADEMARK OFFICE
CERTIFICATE OF CORRECTION

PATENT NO.     : 6,739,035 B2
DATED          : May 25, 2004
INVENTOR(S)    : Larry W. McWilliams It is certified that error appears in the above-identified patent and that said Letters Patent is hereby corrected as shown below:

Column 12,
Line 12, change "conveyor" to -- conveying --

Signed and Sealed this

Twelfth Day of October, 2004

JON W. DUDAS
*Director of the United States Patent and Trademark Office*